United States Patent [19]

Ohsawa

[11] 4,140,878
[45] Feb. 20, 1979

[54] STEREO DEMODULATOR SYSTEM

[75] Inventor: Mitsuo Ohsawa, Fujisawa, Japan

[73] Assignee: Sony Corporation, Tokyo, Japan

[21] Appl. No.: 832,896

[22] Filed: Sep. 13, 1977

[30] Foreign Application Priority Data

Sep. 14, 1976 [JP] Japan ............................ 51-110366

[51] Int. Cl.² .............................................. H04H 5/00
[52] U.S. Cl. ................................. 179/15 BT; 329/50
[58] Field of Search ................ 179/15 BT; 325/36; 329/50, 122, 123

[56] References Cited

U.S. PATENT DOCUMENTS

| | | | |
|---|---|---|---|
| 3,573,382 | 4/1971 | Feit | 179/15 BT |
| 4,049,918 | 9/1977 | Ohsawa | 179/15 BT |

Primary Examiner—Douglas W. Olms
Attorney, Agent, or Firm—Lewis H. Eslinger; Alvin Sinderbrand

[57] ABSTRACT

A stereo demodulator system includes first and second differential amplifiers differentially responding to a first form of a stereo signal and at least a pair of differentially connected transistors serially connected to the output circuit of the first differential amplifier and responding to a second signal related to the first signal. A current mirror circuit is provided from the output circuit of the second differential amplifier to the pair of differentially connected transistors to produce a mixed output signal at the output terminal of the pair of transistors to separate the stereo signal into component signals. An offset current compensator is provided to avoid producing an offset current in the mixed output signal.

14 Claims, 4 Drawing Figures

STEREO DEMODULATOR SYSTEM

BACKGROUND OF THE INVENTION

1. Field of the Invention

The present invention relates generally to a stereo demodulator system and is directed particularly to a differential amplifier with an offset current compensator for use in an integrated circuit embodying such a system.

2. Description of the Prior Art

In my co-pending application Ser. No. 731,018 entitled "MPX Stereo Signal Demodulator" filed Oct. 8, 1976 and assigned to the same assignee as the present case, and which issued as U.S. Pat. No. 4,049,918, I proposed a system that would reduce the offset current of a stereo signal to within a several tens of $\mu A$(micro ampere). However, it is desirable to reduce the offset current still more in the case of a multiplex (MPX) stereo signal demodulator that includes a muting circuit. An offset current amounting to about 10 $\mu A$ or more would produce a rather large noise when the muting circuit was switched ON and OFF.

SUMMARY OF THE INVENTION

Accordingly, an object of the present invention is to provide a stereo demodulator which is free from the defects encountered in the prior art.

Another object of the invention is to provide a stereo demodulator system which is suitable for use with an MPX stereo demodulator formed as an integrated circuit.

The invention is incorporated in a stereo demodulator system provided with first and second differential amplifiers and a first signal input circuit for applying one form of a stereo signal, such as the standard composite stereo signal transmitted on frequency-modulated (FM) stations, as an input signal to first and second differential amplifiers. The system also includes fifth and sixth transistors, the collector-emitter circuits thereof being connected in series with the collectors of the transistors making up the first differential amplifier, and a second signal related to the first signal, as, for example, a subcarrier modulated with a stereo difference signal, is applied to the fifth and sixth transistors. A current mirror circuit having input and output terminals is connected in a serial circuit path between the collector of the third transistor and the collectors of the fifth and sixth transistors, and a signal output circuit is connected to at least one of the collectors of the fifth and sixth transistors.

In accordance with the invention, a current compensating circuit is connected between the input terminal of the current mirror circuit and the collector of one of the transistors making up the second differential amplifier so as to compensate for the base current components of the fifth and sixth transistors.

Other objects, features, and advantages of the present invention will become apparent from the following description taken in conjunction with the accompanying drawings in which the like elements are marked with the like references.

DESCRIPTION OF THE PREFERRED EMBODIMENTS

Figure 1:
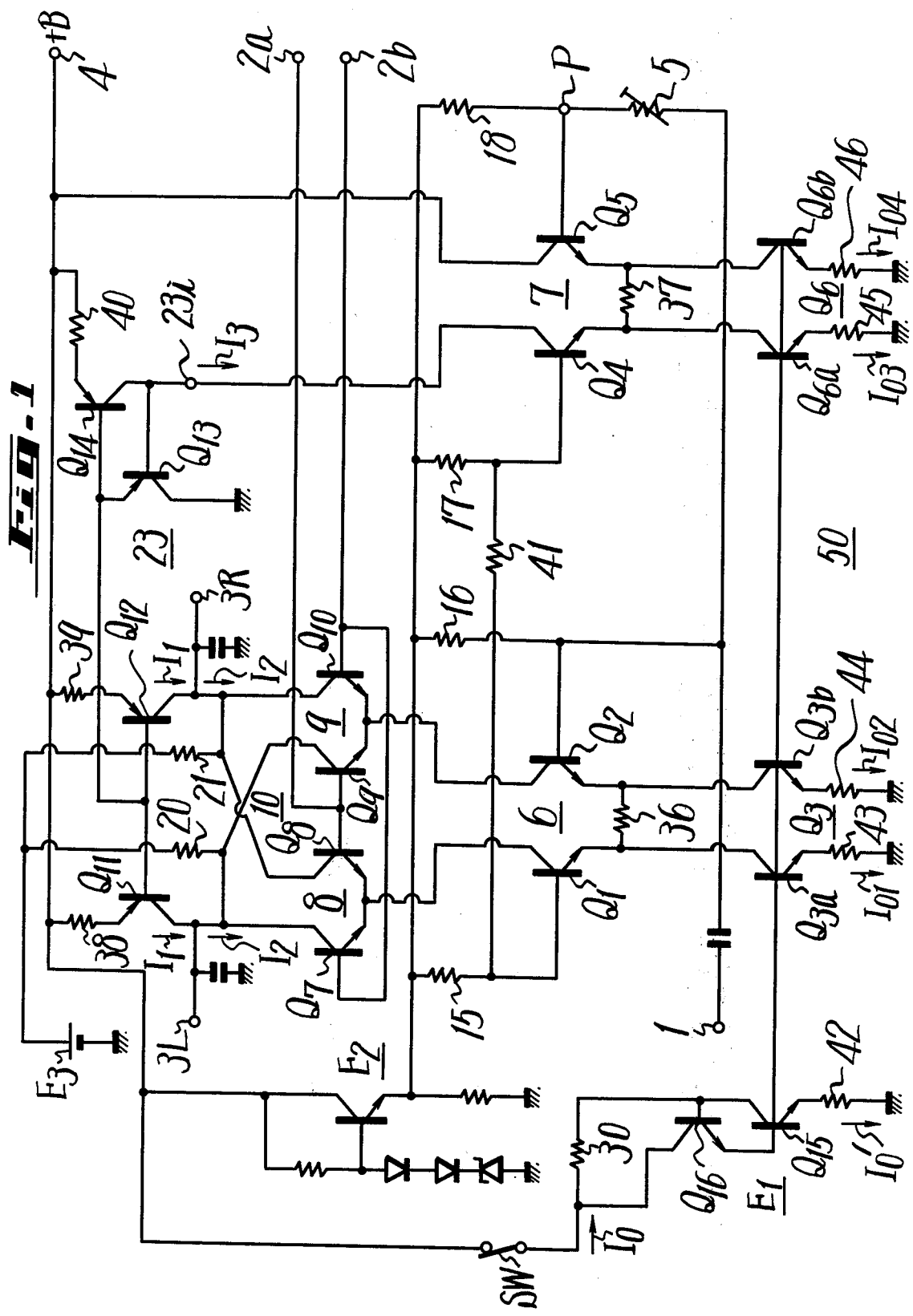
FIG. 1 is a circuit diagram of an MPX stereo demodulator.

Before describing the invention, an example of an MPX stereo demodulator circuit disclosed in my co-pending application U.S. Ser. No. 731,018 (U.S. Pat. No. 4,049,918) will be described with reference to FIG. 1. The circuit includes an input terminal 1 to which a composite stereo signal is applied, input terminals 2a and 2b to which a subcarrier signal of 38 KHz is applied, output terminals 3L and 3R from which stereo demodulated output signal may be obtained as left and right audio signals, and a voltage source terminal 4 to which a power supply source having a voltage of +B is connected. First and second differential amplifier circuits 6 and 7 are connected to receive the composite stereo signal as applied from the terminal 1. In addition, a multiplier circuit 10, which is formed of third and fourth differential amplifier circuits 8 and 9, is included. The subcarrier signal and the composite stereo signal from the first differential amplifier 6 are applied to the circuit 10 to be multiplied together. FIG. 1 also includes a current relay, or current mirror circuit 23.

The first differential amplifier 6 is formed of amplifying transistors $Q_1$, $Q_2$ and a constant current circuit having at least one transistor $Q_3$. The emitters of amplification transistors $Q_1$ and $Q_2$ are connected together through a resistor 36 for improving the linearity of operation of the differential amplifier 6. In this embodiment the constant current circuit includes transistors $Q_{3a}$ and $Q_{3b}$ whose collectors are connected to the emitters of transistors $Q_1$ and $Q_2$ and whose emitters are grounded through resistors 43 and 44, respectively.

The second differential amplifier 7 is much like the first and is formed of amplifying transistors $Q_4$ and $Q_5$ and a constant current circuit including at least one transistor $Q_6$. The emitters of amplification transistors $Q_4$ and $Q_5$ are connected together through a resistor 37, the resistance value of which is selected to have the same resistance as the resistor 36, for improving the linearity of operation of the differential amplifier 7. In the embodiment shown the constant current transistor $Q_6$ actually consists of transistors $Q_{6a}$ and $Q_{6b}$, the collectors of which are connected to the emitters of transistors $Q_4$ and $Q_5$ and the emitters of which are grounded through resistors 45 and 46. The resistance values of the resistors 45 and 46 are chosen to be the same as those of resistors 43 and 44, respectively.

As described above, the multiplier circuit 10 consists of third and fourth differential amplifiers 8 and 9. The third differential amplifier 8 is formed of a pair of amplifying transistors $Q_7$ and $Q_8$, while the fourth differential amplifier 9 is formed of a pair of amplifying transistors $Q_9$ and $Q_{10}$. The third and fourth differential amplifiers 8 and 9 have the subcarrier signal of 38 KHz supplied to them as a balanced input signal via the input terminals 2a and 2b, respectively. The multiplier 10 is connected in series with the collectors of the transistors $Q_1$ and $Q_2$ of the first differential amplifier 6. The collectors of the transistors $Q_7$ and $Q_9$ are connected through a load resistor 20 to a voltage source $E_3$, while the collectors of the transistors $Q_8$ and $Q_{10}$ are connected through a load resistor 21 to voltage source $E_3$. The resistance value of the resistor 20 is the same as that of the resistor 21. The left audio signal output terminal 3L extends from the connection point between the collectors of the transistors $Q_7$ and $Q_9$, while the right audio signal output terminal 3R extends from the connection point between the collectors of the transistors $Q_8$ and $Q_{10}$.

The current relay, or current mirror, circuit 23 includes a transistor $Q_{11}$ having its emitter-collector circuit connected in series with the emitter-collector circuit of each of the transistors $Q_7$ and $Q_9$, and a transistor $Q_{12}$ having its emitter-collector circuit connected in series with the emitter-collector circuit of the transistor $Q_{10}$. The current mirror circuit also includes transistors $Q_{13}$ and $Q_{14}$, which are connected to the collector of the transistor $Q_4$ of the second differential amplifier 7. More specifically, the collectors of the transistors $Q_7$ and $Q_9$ are connected to the collector of the transistor $Q_{11}$, the emitter of which is connected to the voltage supply terminal 4 through an emitter resistor 38 for current feedback, and the collectors of the transistors $Q_8$ and $Q_{10}$ are connected to the collector of the transistor $Q_{12}$, the emitter of which is also connected to the voltage supply terminal 4 through an emitter resistor 39 for current feedback. The collector of the transistor $Q_4$ is connected to the collector of transistor $Q_{14}$ and to the base of transistor $Q_{13}$, and the emitter of transistor $Q_{14}$ is connected to the voltage supply terminal 4 through an emitter resistor 40 for current feedback. The collector of the transistor $Q_{13}$ is grounded, and the emitter of the transistor $Q_{13}$ is connected to the base of the transistor $Q_{14}$ and to the bases of the transistors $Q_{11}$ and $Q_{12}$. In this case, the resistors 38, 39, and 40 are selected to have equal resistances. Thus, the current based upon the composite stereo signal flowing through the collector-emitter path of transistor $Q_{14}$ is relayed to the transistors $Q_{11}$ and $Q_{12}$, respectively.

A bias voltage source E, which supplies a constant voltage in this embodiment, is connected to the bases of the transistors $Q_1$, $Q_2$, $Q_4$ and $Q_5$ of the first and second differential amplifiers 6 and 7 through resistors 15, 16, 17 and 18, which are selected to have equal resistance values. The base of transistor $Q_1$ is connected to the base of transistor $Q_4$ through a resistor 41 that has the same resistance value as that of the resistors 39 and 40. The composite stereo signal is applied via the input terminal 1 to the base of the transistor $Q_2$ of the first differential amplifier 6 and to the base of the transistor $Q_5$ of the second differential amplifier 7 through a variable resistor 5 for separation control and a terminal P, respectively. The terminal P and the common connection point between the base of the transistor $Q_2$ and the resistor 16 are terminals of an integrated circuit that includes the differential amplifiers 6–9, and the variable resistor 5 thus need be connected to the integrated circuit through only the single additional input terminal P.

Bias voltage for constant current transistors $Q_{3a}$, $Q_{3b}$ and $Q_{6a}$, $Q_{6b}$ of first and second differential amplifiers 6 and 7, respectively, is provided by way of a circuit connected between the terminal 4 and ground and consisting of a switch SW for muting control, a resistor 30, the collector-emitter path of a transistor $Q_{15}$, and a resistor 42, connected in series, and a transistor $Q_{16}$, the base and emitter of which are connected to the collector and base, respectively, of the transistor $Q_{15}$ and the collector of which is connected to the connection point between the resistor 30 and the switch SW. The base of the transistor $Q_{15}$ is also connected directly to the bases of transistors $Q_{3a}$, $Q_{3b}$, $Q_{6a}$ and $Q_{6b}$, and the resistors 42, 43, 44, 45 and 46 are all selected to have equal resistances. Thus, a current relay circuit 50 is composed of the transistors $Q_{15}$, $Q_{16}$, $Q_{3a}$, $Q_{3b}$, $Q_{6a}$ and $Q_{6b}$ and the resistors 42, 43, 44, 45 and 46.

The circuit shown in FIG. 1 is to be understood as being used in conjunction with a circuit (not shown) that detects the amplitude of the frequency signal from an FM intermediate frequency amplifier circuit and produces an output signal when the level of the detected signal is lower than a predetermined level. Amplitude detection circuits so connected are well-known. The output signal from the amplitude detection circuit is applied as a muting control signal to the switch SW, which is, in fact, a semiconductor switching element rather than a manual switch, to control the same, i.e., to make it non-conductive in the absence of an intermediate frequency signal of sufficient amplitude.

In the circuit shown in FIG. 1, each of the transistors $Q_1$, $Q_2$, $Q_{3a}$, $Q_{3b}$, $Q_4$, $Q_5$, $Q_{6a}$, $Q_{6b}$, $Q_7$, $Q_8$, $Q_9$ and $Q_{10}$ are NPN-type transistors having the same characteristics, each of the transistors $Q_{11}$, $Q_{12}$ and $Q_{14}$ are PNP-type transistors having the same characteristics, and transistor $Q_{13}$ is a PNP-type (vertical) transistor. The circuit shown in FIG. 1 can be made as an integrated circuit except the variable resistor 5 and the capacitor connecting terminal 1 to the resistor 5.

Figure 2:
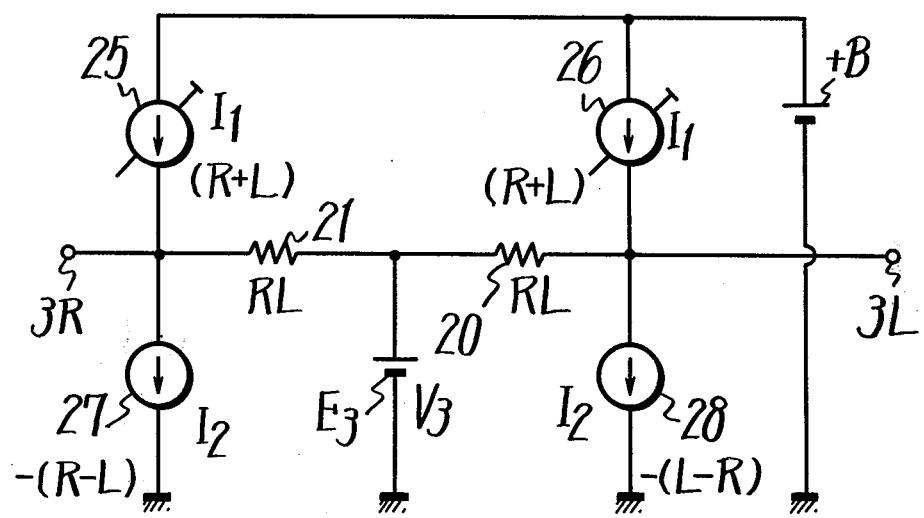
FIG. 2 is an equivalent circuit to that shown in FIG. 1 used for explaining the demodulation theory of the circuit shown in FIG. 1.

The operation of the circuit shown in FIG. 1 will be now described with reference to FIG. 2 which shows an equivalent circuit of FIG. 1. In FIG. 2, the parts corresponding to those of FIG. 1 are marked with the same reference numerals.

In FIG. 2, each of the current sources 27 and 28 of multiplied output signals $-(R-L)$ and $-(L-R)$ includes a direct current $I_2$ from the multiplier circuit 10, and each of the current sources 25 and 26 of the main audio signal $(R+L)$ contained in the composite stereo signal includes a direct current $I_1$ from the second differential amplifier 7. The left audio signal is obtained at the output terminal 3L by adding the currents from current sources 26 and 28, while the right audio signal is obtained at the output terminal 3R by adding the currents from current sources 25 and 27.

In general, the gain of a differential amplifier circuit is determined by the product of the mutual conductance thereof and the load resistance, and the mutual conductance depends upon the constant current of its constant current circuit. Thus, the gain of the differential amplifier reduces as the constant current reduces.

When the level of a received signal is sufficiently high, the switch SW is closed, or made conductive, and hence a predetermined direct current flows through the constant current transistors $Q_{3a}$, $Q_{3b}$ and $Q_{6a}$, $Q_{6b}$ of the first and second differential amplifiers 6 and 7. Thus, these differential amplifiers operate normally, allowing the stereo demodulated output signal, i.e., left and right audio signals, to be obtained at the output terminals 3L and 3R, respectively.

On the other hand, when the level of a received signal is lower than the predetermined level, the switch SW is made non-conductive and the voltage of the source $E_1$ becomes zero. This causes the constant current transistors $Q_{3a}$, $Q_{3b}$ and $Q_{6a}$, $Q_{6b}$ of the first and second differential amplifiers 6 and 7 to be non-conductive so that the current flowing through them becomes zero. Accordingly, no stereo demodulated output signals can be obtained at the output terminals 3L and 3R, which means that the muting operation is in effect.

If the separation control resistor 5 is varied, the amplitude of the composite stereo signal, especially its main audio components, which are fed to the second differential amplifier 7, can be varied. Thus, separation control can be achieved. In this case, since the base potentials of transistors $Q_2$ and $Q_5$ of first and second differential amplifiers 6 and 7, to which the composite stereo signal is supplied, are entirely equal, no direct current flows through the resistor 5 and hence the DC level of the stereo modulated output signals obtained at output terminals 3L and 3R are not changed by variating the resistor 5.

The DC operation of the circuit shown in FIG. 1 will now be described. If the voltage $+B$ at the power supply terminal 4 and the resistance values of resistors 30 and 42 are determined, a direct current $I_0$ flowing through resistor 30 when switch SW is conductive is determined. If the base current of transistors $Q_{3a}$, $Q_{3b}$, $Q_{6a}$ and $Q_{6b}$ are neglected, their DC collector currents coincide with their DC emitter currents $I_{01}$, $I_{02}$, $I_{03}$ and $I_{04}$, respectively.

A DC collector current $I_2$, which will flow through transistors $Q_7$ and $Q_9$ or $Q_8$ and $Q_{10}$ of the multiplier circuit 10, is expressed by the following equation (1) when there is no 38 KHz subcarrier signal applied to the input terminals 2a and 2b:

$$I_2 = \frac{I_{01} + I_{02}}{2} \left(\frac{h_{FE}}{1+h_{FE}}\right)^3 \quad (1)$$

where $h_{FE}$ represents the current amplification factor of each of the NPN-type transistors connected in emitter-grounded configuration.

A collector current $I_3$ of the transistor $Q_4$, which is the direct current flowing through the input terminal 23, of the current mirror 23, is expressed by the following equantion (2).

$$I_3 = I_{03}\left(\frac{h_{FE}}{1+h_{FE}}\right)^2 \quad (2)$$

Further, if it is assumed that the current amplification factor of the transistors $Q_{11}$, $Q_{12}$ and $Q_{14}$ connected in the emitter-grounded configuration is taken as $h'_{FE}$ and that of the transistor $Q_{13}$ as $h''_{FE}$, the ratio between the collector current (direct current) $I_1$ of the transistors $Q_{11}$, $Q_{12}$ and the direct collector current $I_3$ of the transistor $Q_4$ can be expressed as follows:

$$\frac{I_1}{I_3} = \frac{h'_{FE}}{h'_{FE} + \frac{3}{1+h''_{FE}}} = \frac{1}{1 + \frac{3}{(1+h''_{FE})h'_{FE}}} \quad (3)$$

If, in the expression (3), $$\frac{3}{(1+h''_{FE})h'_{FE}} << 1, \quad (4)$$

then $$I_1 = I_3 \quad (5)$$

Further, if the value of $I_3$ in expression (2) is substituted for $I_3$ in expression (3), the current $I_1$ can be expressed as follows:

$$I_1 = \frac{1}{1 + \frac{3}{(1+h''_{FE})h'_{FE}}} \cdot \left(\frac{h_{FE}}{1+h_{FE}}\right)^2 I_{03} \quad (6)$$

Accordingly, the offset current $I_1 - I_2$ between the two output terminals 3L and 3R is expressed as follows:

$$I_1 - I_2 = \left\{\frac{1}{1 + \frac{3}{(1+h''_{FE})h'_{FE}}} \cdot \left(\frac{h_{FE}}{1+h_{FE}}\right)^2 I_{03}\right\} - \left(\frac{I_{01}+I_{02}}{2}\right)\left(\frac{h_{FE}}{1+h_{FE}}\right)^3 \quad (7)$$

A principal object of the present invention is to make the above offset current as small as possible. To this end the following three methods can be considered:

(1) The values of $I_{01}$, $I_{02}$, and $I_{03}$ may be chosen to make $$I_{01} = I_{02} = I_{03} \text{ or } I_{03} = \frac{1}{2}(I_{01} + I_{02});$$

The term $h''_{FE} \cdot h''_{FE}$ may be selected to be large so as to make $$\frac{3}{(1+h''_{FE})h'_{FE}} << 1;$$

and (3) The base currents of the transistors $Q_7$, $Q_8$, $Q_9$ and $Q_{10}$ may be corrected.

If it is assumed that $I_{01} = I_{02} = I_{03} = I'_0$ and if it is also assumed that $$\frac{3}{(1+h''_{FE})h'_{FE}} << 1,$$

the expression (7) can be rewritten as follows:

$$I_1 - I_2 = \left(\frac{h_{FE}}{1+h_{FE}}\right)^2 \cdot \left(\frac{1}{1+h_{FE}}\right) \cdot I'_0 \quad (8)$$

Assuming that $I'_0$ is 1.0 mA(milli-ampere) and $h_{FE}$ is 100 in the equation (8), the offset current $I_1 - I_2$ becomes about 9.7 µA(micro-ampere).

However, an offset current of 9.7 µA will cause a noise voltage to be generated at the output terminals 3L and 3R every time the switch SW is made opened and closed. If the noise voltage can be reduced to less than about 20 to 30 $V_{p-p}$, it may be tolerable. By way of example, if the resistance of the resistors 20 and 21 is 3.3K the offset current must be reduced to less than 1.5 µA. Unfortunately, the value 9.7 A is considerably higher than 1.5 µA. Accordingly, method (3) must be employed in addition to methods (1) and (2).

Thus, making the offset current as small as possible, which is a main object of this invention, is attained by employing method (3).

An example of the differential amplifier circuit according to the present invention will be hereinafter described with reference to FIG. 3. Since the example of the invention shown in FIG. 3 is made by partially improving the MPX stereo demodulating circuit shown in FIG. 1, the parts of FIG. 3 corresponding to those of FIG. 1 are marked with the same reference numerals and symbols and their description will be largely omitted for the sake of brevity.

Figure 3:
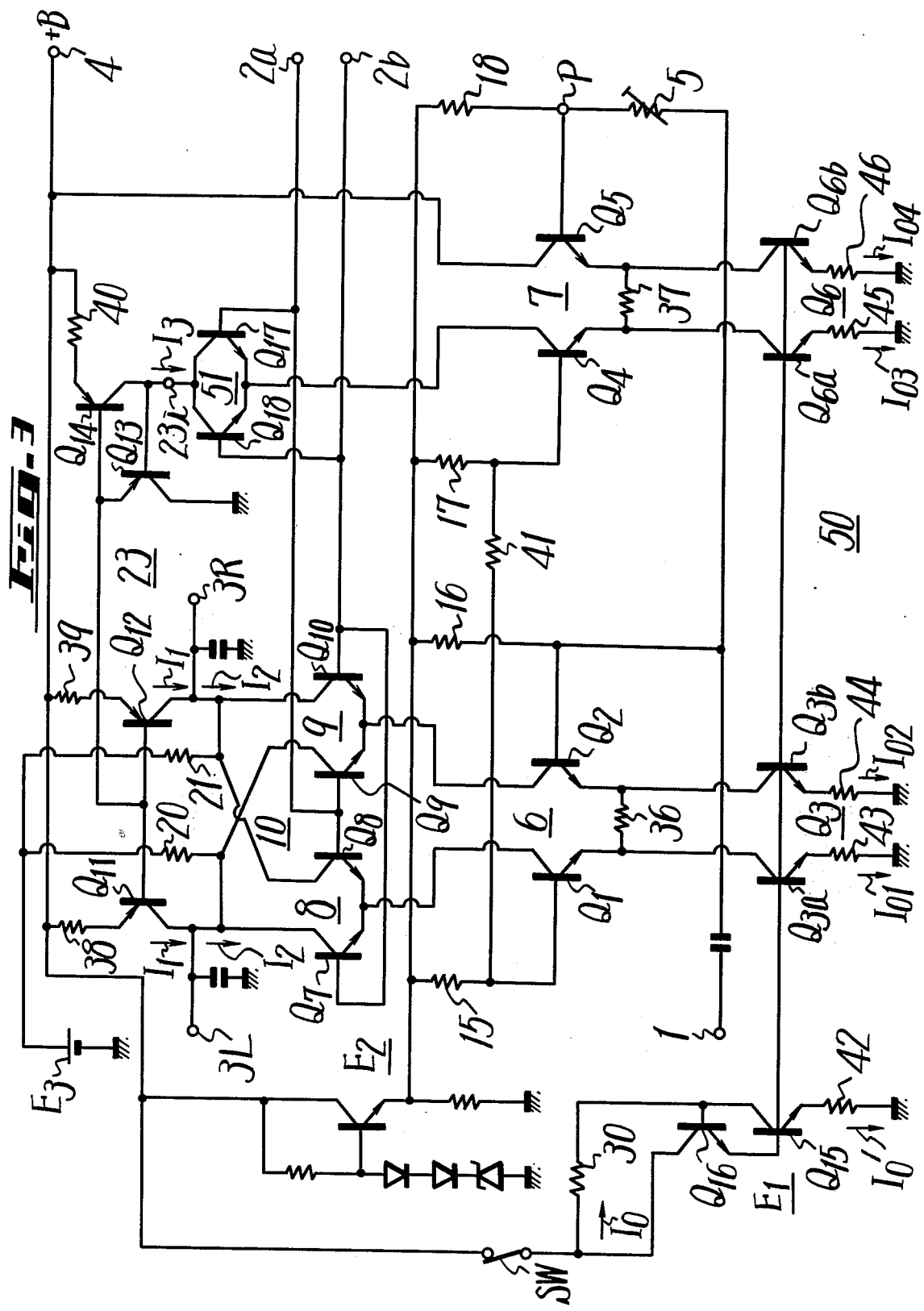
FIGS. 3 and 4 are circuit diagrams showing examples of the stereo demodulator system according to the present invention.

In the example of the invention shown in FIG. 3, a fifth differential amplifier circuit 51 is provided and is supplied with the output signal from the second differential amplifier 7. The output signal of the fifth differential amplifier is supplied to the current mirror circuit 23 through an input terminal $23_i$ of the circuit 23. The fifth differential amplifier circuit 51 consists of a pair of NPN-type transistors $Q_{17}$ and $Q_{18}$, each of which has the same characteristics as the previously-mentioned NPN-type transistors. The transistors $Q_{17}$ and $Q_{18}$ have their collectors connected together to the collector of transistor $Q_{14}$, their emitters connected together to the collector of transistor $Q_4$, and their bases connected to the input terminals 2a and 2b, respectively. The common connection of the collectors of the transistors $Q_{14}$, $Q_{17}$, and $Q_{18}$ is also the input terminal $23_i$.

In the circuit of the invention shown in FIG. 3, the current $I_3$ can be expressed in correspondence with equation (2) as follows:

$$I_3 = I_{03} \left( \frac{h_{FE}}{1 + h_{FE}} \right)^3 \quad (2')$$

Hence, the current $I_1$ of this example can be expressed in correspondence with the equation (6) as follows:

$$I_1 = \frac{1}{1 + \left\{ \frac{3}{(1 + h''_{FE}) h'_{FE}} \right\}} \cdot \left( \frac{h_{FE}}{1 + h_{FE}} \right)^3 \cdot I_{03} \quad (6'')$$

Thus, the offset current $I_1 - I_2$ of this example can be expressed as follows:

$$I_1 - I_2 = \left[ \frac{1}{1 + \left\{ \frac{3}{(1 + h''_{FE}) h'_{FE}} \right\}} \right.$$
$$\left. \left( \frac{h_{FE}}{1 + h_{FE}} \right)^3 \cdot I_{03} \right] - \left( \frac{I_{01} + I_{02}}{2} \right) \left( \frac{h_{FE}}{1 + h_{FE}} \right)^3 \quad (7')$$

In the expression (7'), if it is assumed that $$I_{01} = I_{02} = I_{03} = I_0$$

and $$\frac{3}{(1 + h''_{FE}) h'_{FE}} \ll 1$$

the offset current $I_1 - I_2$ becomes substantially equal to zero.

Figure 4:
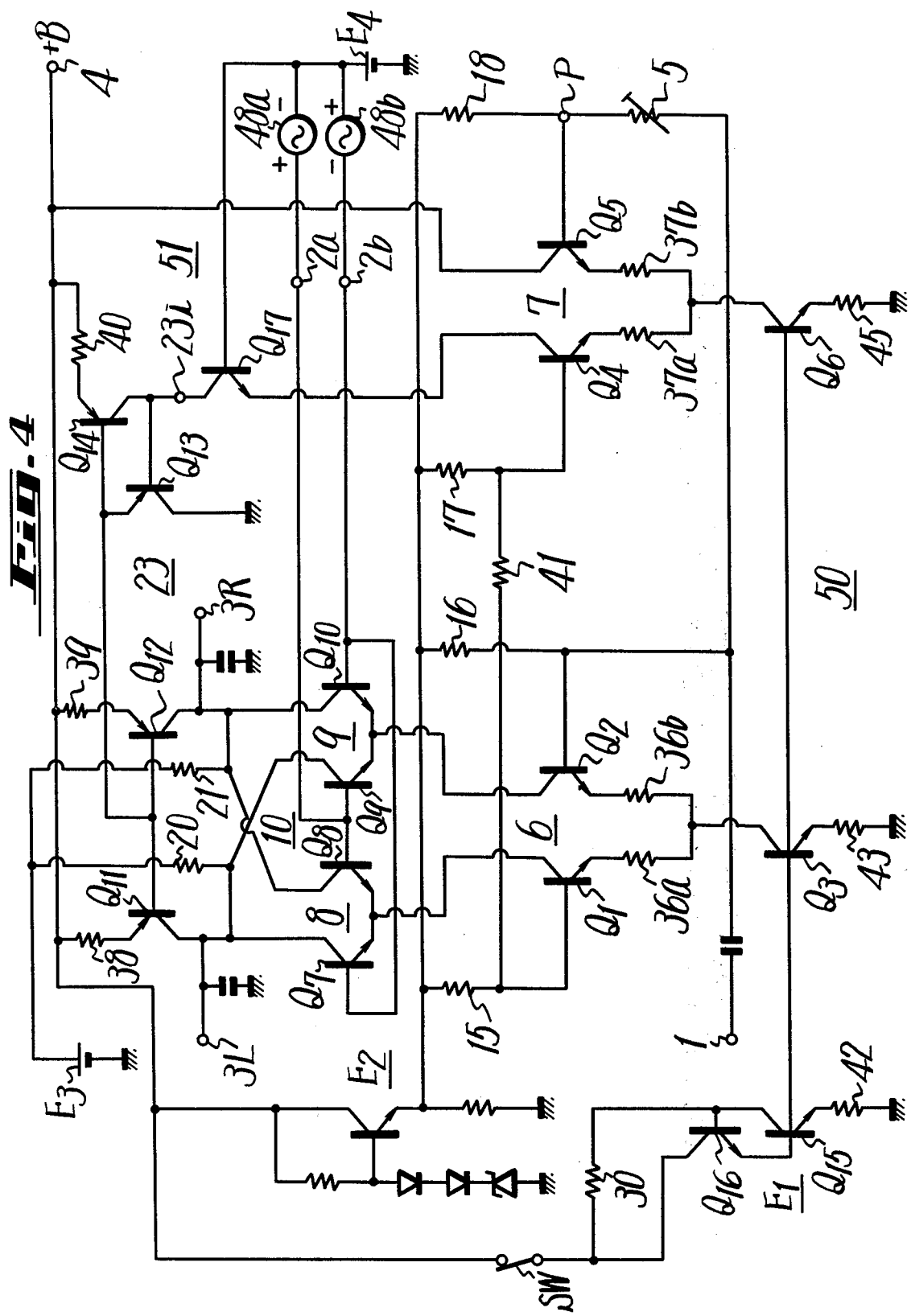

In the example of the invention shown in FIG. 3, the compensating circuit includes two transistors $Q_{17}$ and $Q_{18}$ connected together to form the differential amplifier 51. However, one of the transistors $Q_{17}$ and $Q_{18}$ could be omitted, as illustrated in the embodiment shown in FIG. 4. In this example, only transistor $Q_{17}$ is used in the compensating circuit. The base of the transistor $Q_{17}$ is connected directly to a direct voltage source $E_4$, which is provided for 38KHz subcarrier signal sources 48a and 48b, which are of opposite phase. Further, in the embodiment shown in FIG. 4, NPN-type transistors $Q_3$ and $Q_6$ which have the same characteristics as the transistors $Q_{3a}$, $Q_{3b}$, $Q_{6b}$ are used in place of the latter. The collector of the transistor $Q_3$ is connected through resistors 36a and 36b, which are of equal resistance, to the emitters of the transistors $Q_1$ and $Q_2$, respectively, and the emitter of the transistor $Q_3$ is grounded through the resistor 43. The collector of the transistor $Q_6$ is connected through the resistors 37a and 37b, which have the same resistance, to the emitters of the transistors $Q_4$ and $Q_5$, respectively, and the emitter of the transistor $Q_6$ is grounded through the resistor 45.

According to the present invention, as described above, a circuit in which the desired advantages are obtained comprises first differential amplifier 6, the second differential amplifier 7, a combining differential amplifier circuit formed of a third and a fourth differential ampliers 8 and 9 and supplied with the output signal from the first differential amplifier 6, and the current relay, or mirror, circuit 23. The current mirror circuit 23 has its input terminal $23_i$ connected to the output circuit of the second differential amplifier 7 and its output terminals, which are the collectors of the transistors $Q_{11}$ and $Q_{12}$, connected to the collectors of the transistors $Q_7$, $Q_9$ and $Q_8$, $Q_{10}$, respectively, so that the current mirror 23 is serially connected, that is, connected in series in the signal path from the output circuit of the second differential amplifier 7 to the collectors of the transistors $Q_7$-$Q_{10}$. The current mirror 23 thus provides an output signal to the output terminals of the third and fourth differential amplifiers to be added to the output signal of the third and fourth differential amplifiers. At least one transistor $Q_{17}$ (FIG. 4) or a pair of transistors $Q_{17}$ and $Q_{18}$ (FIG. 3) connected to form the fifth differential amplifier circuit 51, is supplied with the output signal of the second differential amplifier 7, and the output of the fifth differential amplifier circuit is applied to the current relay circuit 23 to adjust the current in the current relay circuit 23 in the sense to compensate for the base-emitter current in the transistors $Q_7$-$Q_{10}$, and thereby to reduce the offset current between the two output terminals 3L and 3R.

It will be apparent that many modifications and variations could be effected by one skilled in the art without departing from the spirit of the present invention so that the scope of the invention should be determined by the following claims only.

I claim:
1. A stereo signal demodulator comprising
   a source of DC voltage;
   a first differential amplifier including at least first and second transistors and each having a base, emitter and collector;
   a second differential amplifier including at least third and fourth transistors each having a base, emitter and collector;
   multiplier circuit means including additional transistors each having a base, emitter and collector and being connected with said first differential amplifier, said multiplier circuit means having said multi- plier circuit means having respective first and second output terminals for providing a demodulated stereo signal, and in which, because of base-emitter currents in said additional transistors, an unwanted offset current appears at said output terminals;

current mirror circuit means connected between said source and one of said collectors of said transistors of the second differential amplifier and between said source and said multiplier circuit means;

input means for applying a composite stereo signal to said first and second differential amplifiers, and for applying a demodulating signal to said multiplier circuit means; and current compensating means interposed between said current mirror circuit means and the collector of one of said third and fourth transistors and being responsive to the collector current of one of said third and fourth transistors for adjusting the current in said current mirror circuit means in the sense to minimize said offset current.

2. A stereo signal demodulator according to claim 1; wherein said additional transistors of the multiplier circuit means include fifth, sixth, seventh and eighth transistors each having a base, emitter and collector, said fifth and sixth transistors are differentially connected to form a third differential amplifier and have their emitters connected to each other and to said collector of said first transistor, said seventh and eighth transistors are differentially connected to form a fourth differential amplifier and have their emitters connected to each other and to said collector of said second transistor, and said collectors of said fifth and seventh transistors, and of said sixth and eighth transistors are connected together to define said first and second output terminals; and said current mirror circuit means is connected between said source and the collectors of the transistors in said second, third and fourth differential amplifiers.

3. A stereo signal demodulator according to claim 2; in which said current compensating means includes:

a ninth transistor having base, emitter, and collector electrodes, the collector-emitter circuit thereof being connected between said current mirror circuit means and the collector of said third transistor; and a current-supplying circuit connected to said ninth transistor and through said current mirror circuit means to said third and fourth differential amplifiers to control the base currents therein so as to maintain said base currents substantially equal to each other.

4. A stereo signal demodulator according to claim 3; in which said current compensating means further includes a tenth transistor having base, emitter, and collector electrodes, the emitter-collector circuits of said ninth and tenth transistors being connected in parallel, so that the total base currents of said ninth and tenth transistors are substantially equal to the base currents in said third and fourth differential amplifiers.

5. A stereo signal demodulator according to claim 3; in which said current mirror circuit means includes:

a first current mirror transistor having base, emitter, and collector electrodes, the emitter-collector circuit of said first current mirror transistor being connected between a direct voltage source and the collectors of said fifth and seventh transistors;

a second current mirror transistor having base, emitter, and collector electrodes, the emitter-collector circuit of said second current mirror transistor being connected between the direct voltage source and the collectors of said sixth and eighth transistors;

a third current mirror transistor having base, emitter, and collector electrodes, the emitter-collector circuit of said third current mirror transistor being connected to the collector of said ninth transistor;

first circuit means coupling the bases of all of said current mirror transistors to each other; and conductive second circuit means for conductively coupling the base of said third current mirror transistor to the collector thereof, so that the collector of said third current mirror transistor acts as an input terminal for said current mirror circuit means and the collectors of said first and second current mirror transistors act as output terminals of said current mirror circuit means.

6. A stereo signal demodulator according to claim 5 in which the second circuit means comprises the base-emitter circuit of another transistor.

7. A stereo signal demodulator according to claim 5; in which said input means is connected to the bases of said fifth, sixth, seventh and eighth transistors in balanced manner and said first and second output terminals provide a pair of multiplied signals in response to signals applied to said input means.

8. A stereo signal demodulator according to claim 7 in which the output signal of said second differential amplifier is applied through said current mirror circuit means to said fifth, sixth, seventh and eighth transistors to mix the output signal to said second differential amplifier with the pair of multiplied output signals produced at said output terminals.

9. A stereo signal demodulator according to claim 8 in which said first signal input means supplies a multiplex stereo composite signal including at least an (L+R) sum audio component and an (L−R) difference audio component, the latter component being suppressed-carrier amplitude-modulated on a 38 KHz subcarrier signal and said second signal input means supplies a 38 KHz switching signal, whereby the pair of output terminals of said signal output means produces a pair of separate L and R audio signals substantially without crosstalk components.

10. A stereo signal demodulator according to claim 9 further including separation controlling means connected to the input of said second differential amplifier.

11. A stereo signal demodulator according to claim 9 in which said separation controlling means comprises a variable resistor.

12. A stereo signal demodulator according to claim 1 further including:

receiving means to receive frequency-modulated signals; and muting circuit means connected to said receiving means to be controlled by the amplitude of signals received thereby and connected to selected ones of said differential amplifiers to render the latter inoperative when the amplitude of said received signals is below a predetermined level.

13. A stereo signal demodulator according to claim 12 in which said muting circuit means is connected to said first and second differential amplifiers to allow current to flow through said first and second differential amplifiers only when a signal of sufficient amplitude is received by said receiving means.

14. A stereo signal demodulator according to claim 1; wherein said first differential amplifier further includes a constant current circuit having at least one transistor connected between the emitters of said first and second transistors and a point of reference potential; and wherein said second differential amplifier further includes a constant current circuit having at least one transistor connected between the emitters of said third and fourth transistors and a point of reference potential.

* * * * *